United States Patent
Ohnmacht et al.

(10) Patent No.: US 6,724,290 B1
(45) Date of Patent: Apr. 20, 2004

(54) MICROCOIL

(75) Inventors: Markus Ohnmacht, Stuttgart (DE); Bernhard Elsner, Kerpen-Horrem (DE)

(73) Assignee: Robert Bosch GmbH, Stuttgart (DE)

( * ) Notice: Subject to any disclaimer, the term of this patent is extended or adjusted under 35 U.S.C. 154(b) by 6 days.

(21) Appl. No.: 09/668,258

(22) Filed: Sep. 22, 2000

(30) Foreign Application Priority Data

Sep. 24, 1999 (DE) .......................................... 199 45 855

(51) Int. Cl.⁷ ................................................. H01F 5/00
(52) U.S. Cl. ..................... 336/200; 257/531; 336/84 R; 336/84 M
(58) Field of Search ........................ 336/83, 200, 84 R, 336/84 M; 257/531; 360/281.5, 281.6, 319

(56) References Cited

U.S. PATENT DOCUMENTS 3,614,554 A * 10/1971 Shield ........................ 336/200
3,903,590 A * 9/1975 Yokogawa .................... 29/591
5,745,981 A * 5/1998 Roshen et al. ............... 336/200
6,114,937 A * 9/2000 Burghartz et al. ........... 336/200
6,275,354 B1 * 8/2001 Huai et al. ................... 360/126

FOREIGN PATENT DOCUMENTS

| DE | 196 40 676 | 10/1997 |
| DE | 199 10 984.2 | 3/1999 |
| JP | 8-194914 | * 7/1996 |

OTHER PUBLICATIONS

Passeraub et al., *First Integrated Inductive Proximity Sensor with On–chip CMOS Readout Circuit and Electrodeposited 1 mm Flat Coil*, Proceedings of Eurosensors XII, 1998. no month.

* cited by examiner

Primary Examiner—Tuyen T. Nguyen
(74) Attorney, Agent, or Firm—Kenyon & Kenyon

(57) ABSTRACT

A coil constructed using the additive technique on the surface of a substrate is characterized in that the conductors of the coil are in contact with an insulating material made at least in part of diamond or diamond-like carbon.

8 Claims, 3 Drawing Sheets

MICROCOIL

FIELD OF THE INVENTION

The present invention relates to a microcoil constructed using an additive technique on a substrate surface.

BACKGROUND INFORMATION

A type of microcoil coil is described in "First Integrated Inductive Proximity Sensor with On-chip CMOS Readout Circuit and Electrodeposited 1 mm Flat Coil," Ph. A. Passeraub et al., *Proceedings of Eurosensors* XII, 1998. Microcoils like these are suitable only for small currents and achieve only a low inductance. They are therefore suitable for sensor purposes but not for switching applications requiring high currents and inductances, for example. If microcoils of the known design were to be used for high currents and inductances, this would have resulted in an extremely high requirement of substrate surface, because the inductance of the known coil can be increased only by adding additional coils on the outer circumference, so that for this reason alone, the surface requirement would increase in proportion to the inductance. At the same time, the cross section of the printed conductors would have to be increased for a greater current carrying capacity, but that would also lead to a greater surface requirement.

Although essentially the surface requirement can be reduced by forming a microcoil with several superimposed planes of conductors, as described in German Published Patent Application No. 196 40 676, such a coil design leads to the problem that the heat released by the current flowing through the conductor can no longer be dissipated as effectively as with a single-layer design. Therefore, with the same conductor cross section, the current carrying capacity of such a coil is lower than that of a coil whose conductors are arranged in a single plane.

SUMMARY OF THE INVENTION

The present invention creates a structure for a microcoil constructed using the additive technique, making it possible to construct coils having a high inductance and a low resistance suitable for high-current applications.

This advantage is achieved by the fact that the conductors of the coil are in contact with an electrically insulating body having at least some diamond or diamond-like carbon. Diamond has an extremely high thermal conductivity of approx. 20 W/cmK and a high breakdown field strength of approx. $10^7$ V/cm, and it is thus equally suitable as an electric insulation material and a thermal conduction material. Diamond-like carbon (DLC) has in common with true diamond the $sp^3$ or $sp^2$ hybridization of the carbon atoms of its crystal structure, and therefore it has similarly advantageous thermal conduction and insulation properties.

The coil is advantageously surrounded by a sheathing of a magnetically shielding material to prevent the relatively strong magnetic fields that can be generated with such a microcoil from having feedback effects on adjacent circuits and also to improve the inductance of the coil as such. Such a material may be a nickel-iron alloy or a nickel-cobalt alloy, for example.

According to a first variant of the present invention, the insulating body is composed at least in part of a mixture containing diamond crystals and optionally containing oxide-nitride or polymer materials, for example, as additional components.

The coil according to the present invention can be manufactured especially easily if the mixture is a photolithographically structurable polymer material. This material can be applied to a large area of substrate surface, and the conductors of the coil can be made to grow, e.g., by galvanic techniques trenches produced in the material in the course of structuring.

According to a second preferred variant of the present invention, the insulating body includes at least one layer of diamond or diamond-like carbon extending over the entire cross section of the coil. There may be individual openings in the layer which do not significantly impair its thermal conductivity, in particular as passages for printed conductors.

For effective cooling of the conductors, the at least one layer of diamond or diamond-like carbon is preferably arranged in direct contact with the conductors to be cooled.

This second variant is especially advantageous in the case of a compact design of the coil, where the conductors are arranged in multiple planes. In this case, each plane is provided with at least one layer of diamond or diamond-like carbon.

Furthermore, the substrate carrying the coil is preferably a semiconductor substrate, and the coil is connected to an integrated circuit arranged in the substrate beneath it.

Additional advantages and features of the present invention are derived from the following description of embodiments with reference to the figures.

DETAILED DESCRIPTION

Figure 1:
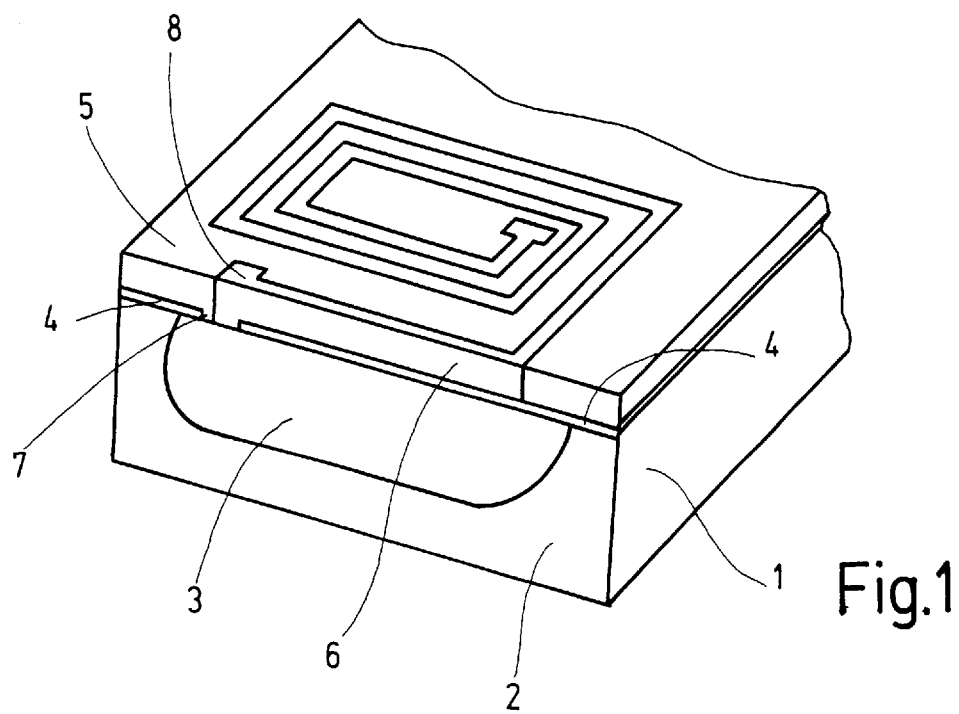
FIG. 1 shows a perspective view and a sectional view of a microcoil on a semiconductor substrate according to a first embodiment of the present invention.

FIG. 1 shows a semiconductor substrate 1, illustrated in a sectional view on its edge 2 facing the observer. Sectional edge 2 shows an integrated circuit 3 constructed in the substrate, a passivation layer 4 and a cover layer 5 having a printed conductor 6 embedded in it in the form of a spiral. Cover layer 5 and passivation layer 4 together form an insulating body with the printed conductor embedded in it.

Passivation layer 4 here is a diamond or diamond-like layer deposited on substrate 1 in a plasma method known per se, for example. Such deposition methods are known to be used to produce wear-reducing coatings on tool surfaces.

An opening 7 in passivation layer 4 is produced by masking and working the layer with an $H_2$ plasma. An end section 8 of printed conductor 6 is in conducting contact with the surface of integrated circuit 3 through this opening.

Printed conductor 6 is in direct contact with the surface of diamond layer 4 and can therefore release heat through it in a highly effective manner.

Cover layer 5 may be made of a polymer material or a heat-resistant inorganic oxide material or nitride material, optionally containing some diamond crystals or DLC material.

Figure 2:
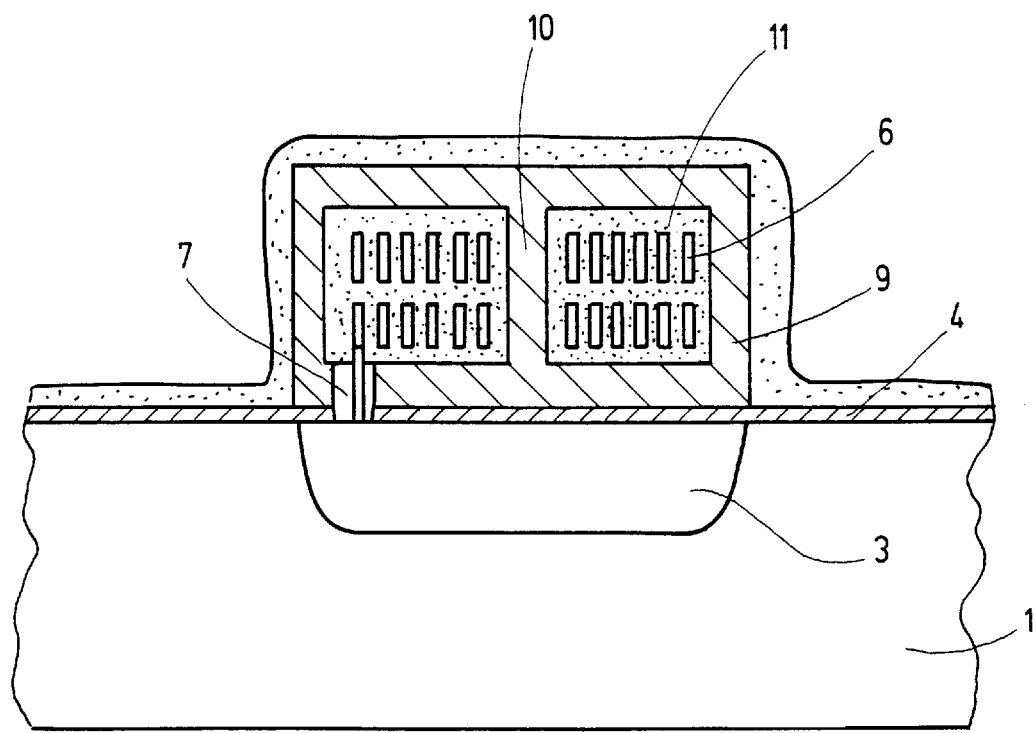
FIG. 2 shows a sectional view of a microcoil according to a second embodiment of the present invention.

FIG. 2 shows a further developed example of a microcoil according to the present invention in a sectional view parallel to its axis, i.e. perpendicular to the surface of the substrate.

Substrate 1 is again a semiconductor substrate having an integrated circuit 3 on its surface. The substrate and the circuit are coated with a passivation layer 4, which may have an oxidic or nitridic composition here in the traditional manner. Above integrated circuit 3, a microcoil arranged on the substrate is surrounded on all sides (except for openings 7, which relate to the electric power supply) by a sheathing 9 having a high magnetic permeability, e.g., made of a nickel-iron alloy or a nickel-cobalt alloy.

Inside sheathing 9, conductors 6 of the microcoil are arranged in two spiral layers around a coil core 10 made of the same material as sheathing 9.

Inside sheathing 9, conductors 6 are embedded in an electrically insulating, heat conducting body 11 containing at least some diamond or diamond-like carbon. The design of this insulating body 11 may vary depending on the process steps used to construct the microcoil on the substrate. The design of insulating body 11 is derived from the method of producing the coil as described below.

Figure 3:
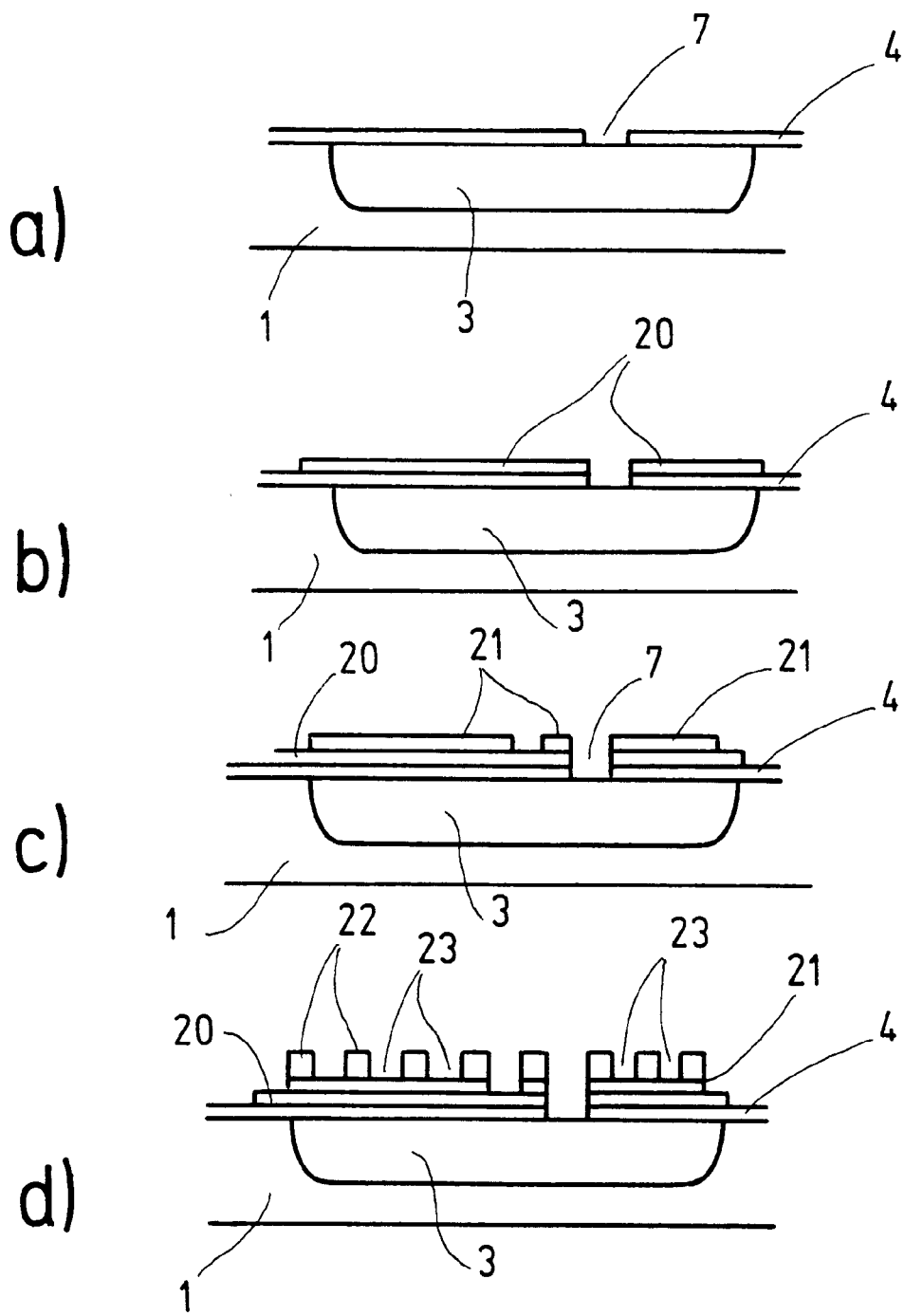
FIG. 3a shows a first stage in the production of the microcoil from FIG. 2.
FIG. 3b shows a second stage in the production of the microcoil from FIG. 2.
FIG. 3c shows a third stage in the production of the microcoil from FIG. 2.
FIG. 3d shows a fourth stage in the production of the microcoil from FIG. 2.
FIG. 3e shows a fifth stage in the production of the microcoil from FIG. 2.
FIG. 3f shows a sixth stage in the production of the microcoil from FIG. 2.
FIG. 3g shows a seventh stage in the production of the microcoil from FIG. 2.
FIG. 3h shows an eighth stage in the production of the microcoil from FIG. 2.
Figure 3:
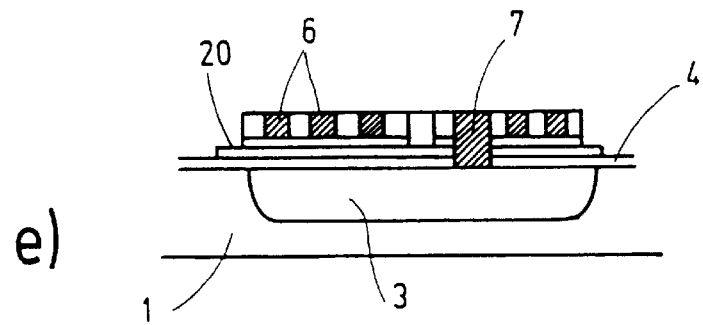
Figure 3:
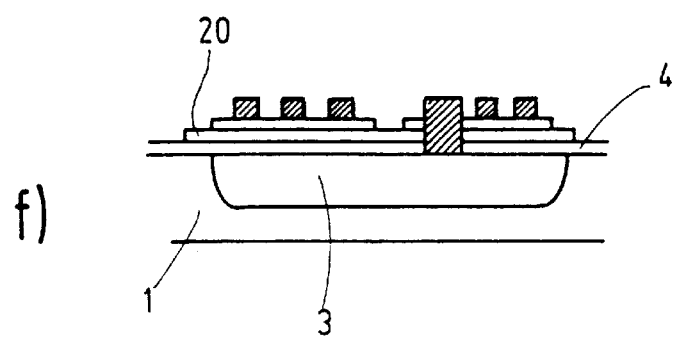
Figure 3:
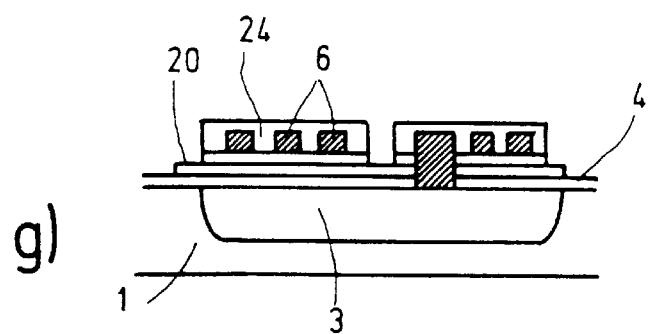
Figure 3:
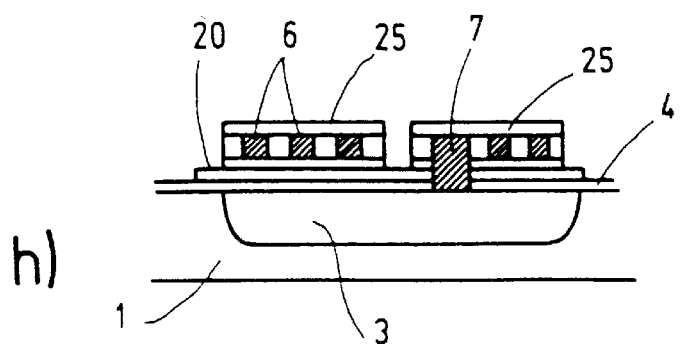

Each method is based on a semiconductor substrate having a completely developed integrated circuit in it and a passivation layer deposited on the surface of the substrate having openings 7 for the lead-through of a power supply to the coil (see FIG. 3a).

A first alloy layer is deposited on the substrate, e.g., by sputtering, and is structured and etched to form base 20 of sheathing 9 (see FIG. 3b).

A diamond or DLC layer 21 is deposited on base 20 (FIG. 3c). The thickness of layer 21 may be kept extremely low because of the high breakdown strength.

In the next step (FIG. 3D), a photostructurable polymer layer 22 is applied, and a pattern of trenches 23 is produced in the area thereof above layer 21, the pattern of trenches corresponding to one layer of the conductors of the coil to be produced.

To be able to carry the highest possible currents at a given base area of the coil, it is desirable for the conductors to have a low resistance and consequently a large conductor cross section. The trenches 23 are produced having a high aspect ratio, i.e., trenches 23 should be narrow and deep. To this end, a photoresist polymer material with an epoxy base is especially suitable.

A special method suitable for producing deep trenches with steep walls in a variety of polymer materials is described in German Published Patent Application No. 199 10 984.2, which was not published previously. According to this method, trenches 23 are produced by first depositing a layer of a hard substance on polymer layer 22 by a method known per se such as plasma deposition, sputtering or vapor deposition and structuring this layer, so that the pattern of trenches is formed first in the structured hard substance layer. A suitable hard substance layer would be, for example, an oxide or a nitride deposited from a plasma, such as SiN, TiN or $SiO_2$, as well as metal layers such as Al.

Trenches 23 are produced in polymer layer 22 in a plasma etching installation, such as an ECR or ICP etching installation using an etching gas containing oxygen, preferably pure oxygen to which a light ionizable gas is added, e.g., $He^4$ or especially preferably $He^3$ or hydrogen. Ions of the etching gas are accelerated in the direction of the substrate surface which has been cooled to a temperature of $-30°$ C. to $-120°$ C., preferably $-65°$ C., and is to be etched, thereby removing material at the base of the trenches in polymer layer 22. Electrons moving randomly in the etching gas adhere to the sides of the resulting trenches 23, where they can build up a static charge, and are neutralized by the ions of the light gas. This prevents etching gas ions which penetrate into the trenches from being deflected toward the sides of the trenches and attacking them. It is thus easy to produce trenches having a high aspect ratio. FIG. 3d illustrates the result of the etching process.

In a following process step, trenches 23 and opening 7 are filled with metal to form conductors 6 of the coil (FIG. 3e). Galvanic methods may be used for this purpose.

Further manufacture may take place in different variants. According to a first variant, after producing conductors 6, the residues of polymer layer 22 are removed, as is known for polymer layers of photoresist material in general (FIG. 3f). In another process step, conductors 6 are covered with a layer of insulating material 24, except for an opening (not shown) for contacting another layer of the coil to be produced above that one. Insulating material 24 is made of an oxide material or nitride material, for example, such as $Al_2O_3$, $SiO_2$, $Si_3N_4$, etc. having a high thermal stability. To improve the dissipation of heat from conductors 6 of the coil to the outside, insulating material 24 may be provided with some crystalline diamond or diamond-like carbon; if economical, insulating material 24 may even be made mainly or almost completely of such a material.

Layer 24 may be applied in the form of a film which is pressed onto the surface of substrate 1 so that its insulating material penetrates into the interspaces between conductors 6; it is also possible to apply material 24 by spreading a paste.

If, as part of the demands made of the coil to be produced, the material of polymer layer 22 itself has sufficient thermal stability and/or a good thermal conductivity, then removal of this material may also be omitted, and according to a second variant of the production process, another layer 25 of diamond or diamond-like carbon is deposited on the joint surface of conductors 6 and polymer layer 22 following production of conductors 6 according to FIG. 3e (see FIG. 3h) and except for an opening (not shown), it electrically insulates conductors 6 from the conductors of another coil layer to be formed above it.

To achieve good thermal conductivity of polymer layer 22, it may already be provided with diamond.

To produce additional layers of the coil, the steps described with respect to FIGS. 3d through g and 3d, e, h are repeated according to the number of layers to be produced.

The outsides of sheathing 9 and coil core 10 are deposited galvanically in a last process step to complete the coil structure illustrated in FIG. 2.

What is claimed is:

1. A coil, comprising:

a plurality of conductors in contact with an insulating body;

wherein the insulating body includes one of diamond and a diamond-like carbon;

wherein the coil includes a structure arranged on a surface of a substrate and constructed thereon using an additive technique, wherein the substrate is a semiconductor substrate, wherein the coil is connected to an integrated circuit arranged in the substrate beneath the coil; and wherein the structure of the coil is connected to the integrated circuit at a location in the substrate.

2. The coil according to claim 1, wherein:

the coil is surrounded by a sheathing of a magnetically shielding material.

3. The coil according to claim 1, wherein:

the insulating body includes at least a mixture containing diamond crystals.

4. The coil according to claim 3, wherein:

the mixture includes one of an oxide, a nitride, and a polymer material.

5. The coil according to claim 3, wherein:

the mixture includes a photolithographically structurable polymer material.

6. The coil according to claim 1, wherein:

the insulating body includes at least one layer of one of the diamond and the diamond-like carbon extending over an entire cross section of the coil.

7. The coil according to claim 6, wherein:

the at least one layer of one of the diamond and the diamond-like carbon is arranged in direct contact with the plurality of conductors.

8. The coil according to claim 6, wherein:

the plurality of conductors are arranged in multiple planes, each plane being provided with at least one of the at least one layer of the diamond and the diamond-like carbon.

* * * * *